United States Patent
Ito

(10) Patent No.: US 11,251,757 B2
(45) Date of Patent: Feb. 15, 2022

(54) HIGH-FREQUENCY FRONT-END CIRCUIT

(71) Applicant: Murata Manufacturing Co., Ltd., Kyoto (JP)

(72) Inventor: Masahiro Ito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 58 days.

(21) Appl. No.: 16/797,114

(22) Filed: Feb. 21, 2020

(65) Prior Publication Data

US 2020/0274503 A1 Aug. 27, 2020

(30) Foreign Application Priority Data

Feb. 27, 2019 (JP) .............................. JP2019-034938

(51) Int. Cl.
*H03F 3/195* (2006.01)
*H03F 1/56* (2006.01)
*H03F 3/21* (2006.01)

(52) U.S. Cl.
CPC ............. *H03F 3/195* (2013.01); *H03F 1/565* (2013.01); *H03F 3/211* (2013.01)

(58) Field of Classification Search
CPC ........... H03F 3/195; H03F 1/565; H03F 3/211
USPC ....................................................... 330/307
See application file for complete search history.

(56) References Cited

U.S. PATENT DOCUMENTS

| 2012/0264482 | A1* | 10/2012 | Bhagat | ................ H01L 23/5227 |
| | | | | 455/550.1 |
| 2014/0191800 | A1* | 7/2014 | Jordan | ..................... H03F 1/00 |
| | | | | 330/190 |
| 2018/0006626 | A1 | 1/2018 | Lyalin et al. | |

\* cited by examiner

*Primary Examiner* — Hafizur Rahman
(74) *Attorney, Agent, or Firm* — Pearne & Gordon LLP

(57) ABSTRACT

A high-frequency front-end circuit includes a plurality of power amplifiers. Power supply inductors and matching inductors for the power amplifiers are formed of conductors disposed on a substrate. The power supply inductors and the matching inductors are disposed on or in different layers. When the substrate is seen in a plan view, at least a portion of the first power supply inductor and at least a portion of the second matching inductor overlap each other with an insulating layer interposed therebetween.

22 Claims, 7 Drawing Sheets

HIGH-FREQUENCY FRONT-END CIRCUIT

This application claims priority from Japanese Patent Application No. 2019-034938 filed on Feb. 27, 2019. The content of this application is incorporated herein by reference in its entirety.

BACKGROUND OF THE DISCLOSURE

1. Field of the Disclosure

The present disclosure relates to high-frequency front-end circuits.

2. Description of the Related Art

A high-frequency front-end circuits mounted on a mobile wireless communication terminal device, such as a cellular phone or a smartphone, may have a configuration in which a plurality of power amplifiers for amplifying high-frequency signals with different transmission frequencies are disposed on the same substrate. Such a high-frequency front-end circuit is typically configured to operate the plurality of power amplifiers in an exclusive manner.

An inductor for use in supplying power (hereinafter referred to as a power supply inductor) is disposed in a power supply path to a power amplifier. An inductor for use in matching (hereinafter referred to as a matching inductor) is disposed in a path along which high-frequency signals of the power amplifier are outputted. One possible configuration is the one in which those inductors are formed of wires on a substrate. For that configuration, an increased substrate size is a problem. U.S. Patent Application Publication No. 2018/0006626 describes a configuration in which a power supply inductor and a matching inductor are disposed on different layers in an integrated passive device (IPD) such that they overlap each other.

In the above-described power amplifier configuration, if the power supply inductor and the matching inductor interfere with each other by being electromagnetically coupled to each other and a feedback path for high-frequency signals appears, the output characteristics may degrade, for example, high-order harmonic waves may increase. This may even lead to the oscillation of the power amplifier.

BRIEF SUMMARY OF THE DISCLOSURE

Accordingly, it is an object of the present disclosure to achieve a high-frequency front-end circuit that can be miniaturized while suppressing the degradation in output characteristics for high-frequency signals.

According to preferred embodiments of the present disclosure, a high-frequency front-end circuit includes a plurality of power amplifiers, a plurality of power supply inductors disposed in power supply paths to the plurality of power amplifiers, respectively, output matching circuits connected to output terminals of the plurality of power amplifiers, respectively, each of the output matching circuits including a matching inductor, and a substrate on or in which at least the power supply inductors and the matching inductors are disposed. Each of the power supply inductors includes a power supply inductor wire formed of a conductor at least partially disposed on or in the substrate. Each of the matching inductors includes a power supply inductor wire formed of a conductor at least partially disposed on or in the substrate. The plurality of power amplifiers include a first power amplifier and a second power amplifier different from the first power amplifier, and a first power supply inductor wire disposed in the power supply path to the first power amplifier and a second matching inductor wire disposed in the output matching circuit for the second power amplifier are disposed on or in different layers in the substrate. When the substrate is seen in a plan view, at least a portion of the first power supply inductor wire and at least a portion of the second matching inductor wire overlap each other with an insulating layer interposed therebetween.

In that configuration, the high-frequency front-end circuit can be miniaturized while the degradation in output characteristics for high-frequency signals can be suppressed.

Preferred embodiments of the present disclosure can provide the high-frequency front-end circuit that can be miniaturized while suppressing the degradation in output characteristics for high-frequency signals.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

High-frequency front-end circuits according to the embodiments are described in detail below with reference to the drawings. The embodiments do not limit the present disclosure. The embodiments are illustrative, and the configurations in different embodiments can be replaced in part or combined. The description on points common to a first embodiment is omitted in second and subsequent embodiments, and only different respects are described. In particular, similar operational advantages from similar configurations are not fully described in each embodiment.

First Embodiment

Figure 1:
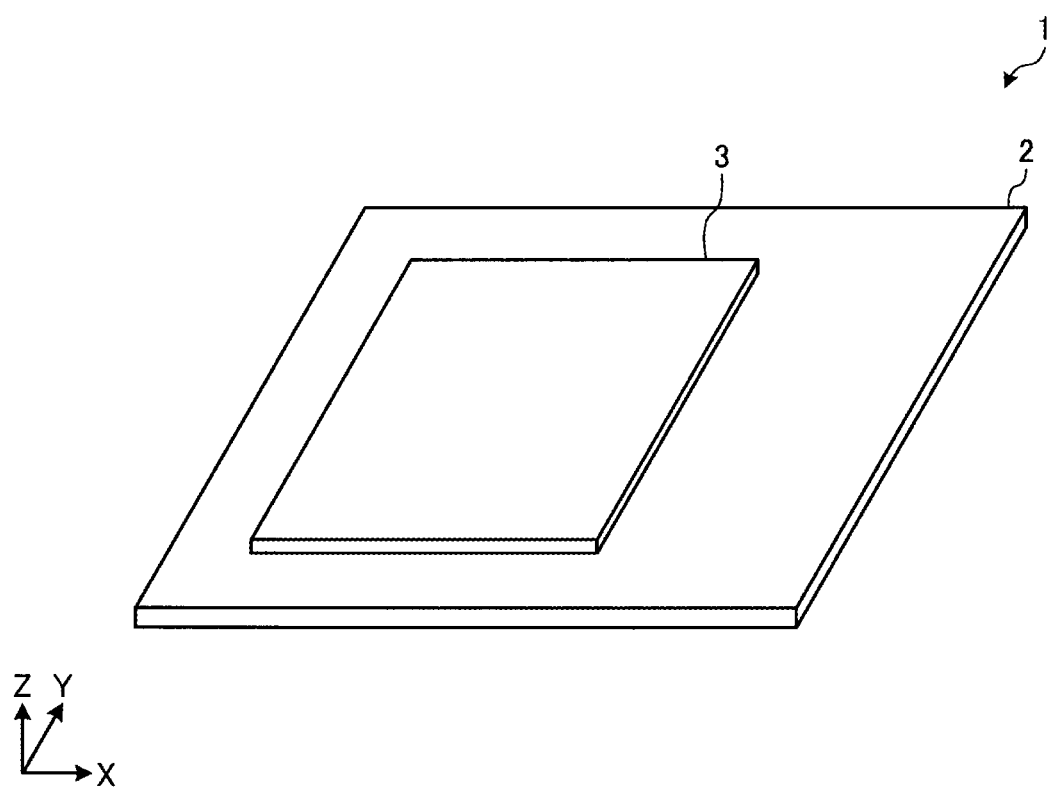
FIG. 1 illustrates an external appearance of a high-frequency front-end circuit according to a first embodiment.

FIG. 1 illustrates an external appearance of a high-frequency front-end circuit according to a first embodiment. A high-frequency front-end circuit 1 according to the first embodiment includes a substrate 2 and a substrate 3.

The high-frequency front-end circuit 1 can be used in a mobile wireless communication terminal device, such as a cellular phone or a smartphone, to transmit and receive various signals of, for example, voice and data, to and from a base station.

The substrate 2 is a non-semiconductor substrate. Examples of the substrate 2 may include a rigid substrate made of, for example, a glass epoxy resin or low-temperature co-fired ceramic (LTCC) and a flexible substrate made of, for example, a liquid crystal polymer or polyimide resin.

The substrate 3 is a semiconductor substrate. As the substrate 3, an integrated circuit (IC) chip (die) is illustrated as an example.

The substrate 2 is substantially parallel with an X-Y plane. The substrate 3 is substantially parallel with the X-Y plane. As viewed from a Z direction, the substrate 3 overlaps the substrate 2. The substrate 2 has an area equal to or larger than the region overlapping the substrate 3.

The substrate 2 is a multilayer substrate including a plurality of wire layers. The substrate 2 includes the plurality of wire layers. Examples of the material of each of the wire layers may include aluminum, an alloy including aluminum, gold, an alloy including gold, copper, and an alloy including copper. An insulator is disposed between the wire layers.

The substrate 3 in the present embodiment corresponds to "first substrate" in the present disclosure. The substrate 2 in the present embodiment corresponds to "second substrate" in the present disclosure.

Figure 2:
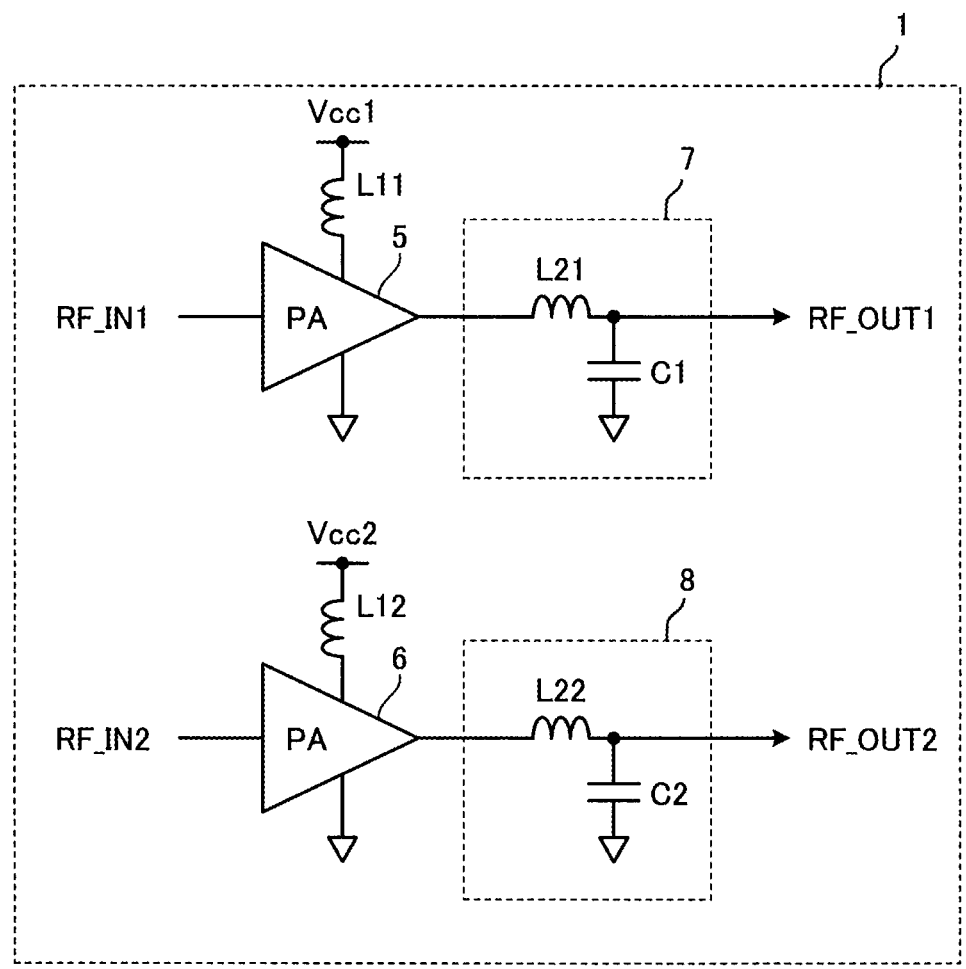
FIG. 2 is a block diagram of the high-frequency front-end circuit according to the first embodiment.

FIG. 2 is a block diagram of the high-frequency front-end circuit according to the first embodiment. The high-frequency front-end circuit 1 includes a first power amplifier 5, a second power amplifier 6, a first output matching circuit 7, and a second output matching circuit 8.

A first power supply voltage Vcc1 is applied to the first power amplifier 5 through a first power supply inductor L11.

A second power supply voltage Vcc2 is applied to the second power amplifier 6 through a second power supply inductor L12.

The first power amplifier 5 amplifies a first high-frequency input signal RF_IN1 and outputs a first high-frequency output signal RF_OUT1 through the first output matching circuit 7. The first output matching circuit 7 includes at least a first matching inductor L21 and a first capacitor C1.

The second power amplifier 6 amplifies a second high-frequency input signal RF_IN2 and outputs a second high-frequency output signal RF_OUT2 through the second output matching circuit 8. The second output matching circuit 8 includes at least a second matching inductor L22 and a second capacitor C2.

In the present disclosure, for example, the first power amplifier 5 and second power amplifier 6 may deal with different frequency bands and operate exclusively. That is, when the first power amplifier 5 is in operation, the second power amplifier 6 does not operate. When the second power amplifier 6 is in operation, the first power amplifier 5 does not operate.

The example illustrated in FIG. 2 is an example configuration including the two power amplifiers of the first power amplifier 5 and second power amplifier 6, but the present disclosure is not limited to that example. Each of the first output matching circuit 7 and second output matching circuit 8 includes at least a matching inductor and is not limited to the above-described configuration. The present disclosure is not limited by the number of power amplifiers and the configuration of the output matching circuits.

Figure 3:
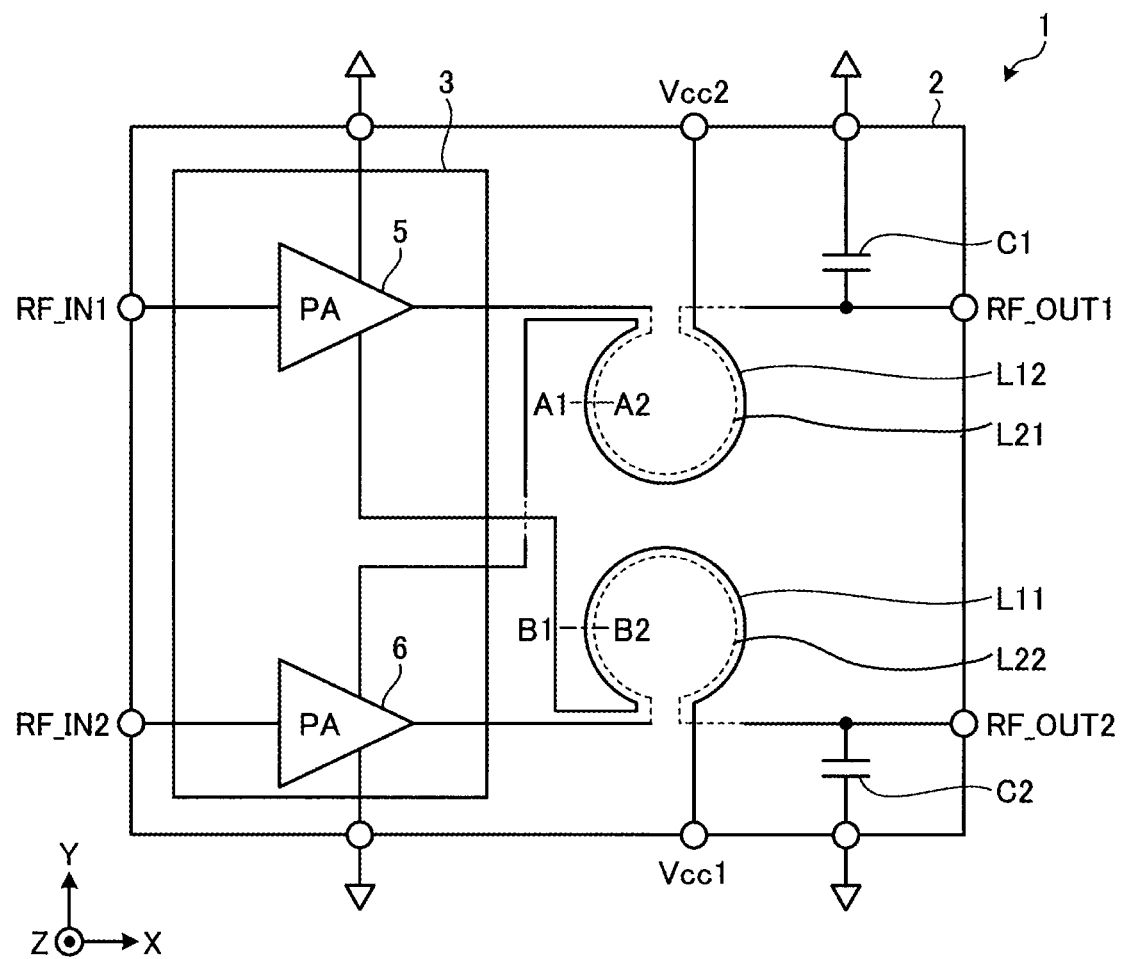
FIG. 3 is a schematic diagram illustrating a configuration of the high-frequency front-end circuit according to the first embodiment.

FIG. 3 is a schematic diagram illustrating a configuration of the high-frequency front-end circuit according to the first embodiment.

In the present embodiment, the first power amplifier 5 and second power amplifier 6 are disposed on the substrate 3. In the present embodiment, the first power supply inductor L11, second power supply inductor L12, first matching inductor L21, second matching inductor L22, first capacitor C1, and second capacitor C2 are disposed on or in the substrate 2.

As described above, in the present embodiment, the substrate 3 is a semiconductor substrate and constitutes an IC chip arranged on the substrate 2. The IC chip includes the first power amplifier 5 and second power amplifier 6, and is mounted on the substrate 2, which is a non-semiconductor substrate, and they form the high-frequency front-end circuit 1.

The first power supply inductor L11, second power supply inductor L12, first matching inductor L21, second matching inductor L22, first capacitor C1, and second capacitor C2 are formed of conductors disposed on or in the wire layers in the substrate 2. The first capacitor C1 and second capacitor C2 may be surface mount devices (SMDs) mounted on the surface of the substrate 2. Each of the first power supply inductor L11, second power supply inductor L12, first matching inductor L21, and second matching inductor L22 may be a combination of an inductor wire formed of a conductor disposed on or in the substrate 2 and a SMD mounted on the surface of the substrate 2 to obtain a necessary individual inductance value. In the following description, the configuration in which each of the first power supply inductor L11, second power supply inductor L12, first matching inductor L21, and second matching inductor L22 is formed of the inductor wire alone is described as an example, but the present disclosure is not limited to that example. In the present disclosure, because the inductor wire is a wire designed for acquiring a preferable inductance, the inductor wire is defined as a wire whose length is intentionally lengthened, such as a meandering wire, a spiral wire, or an arc-shaped wire, as seen in a plan view or a wire whose width is intentionally narrowed.

Figure 4A:
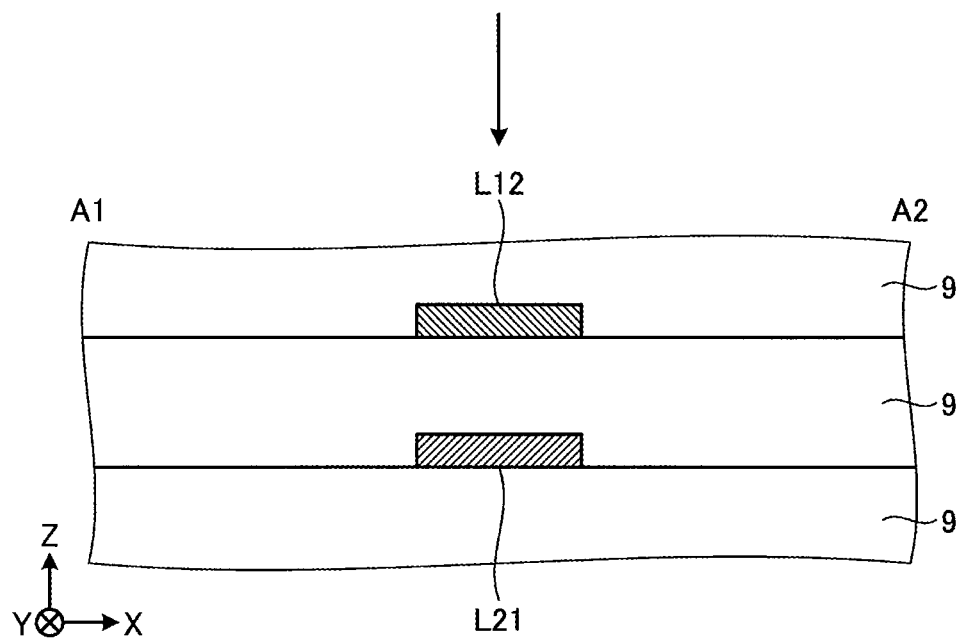
FIG. 4A is a cross-sectional view taken along line A1-A2 illustrated in FIG. 3.
Figure 4B:
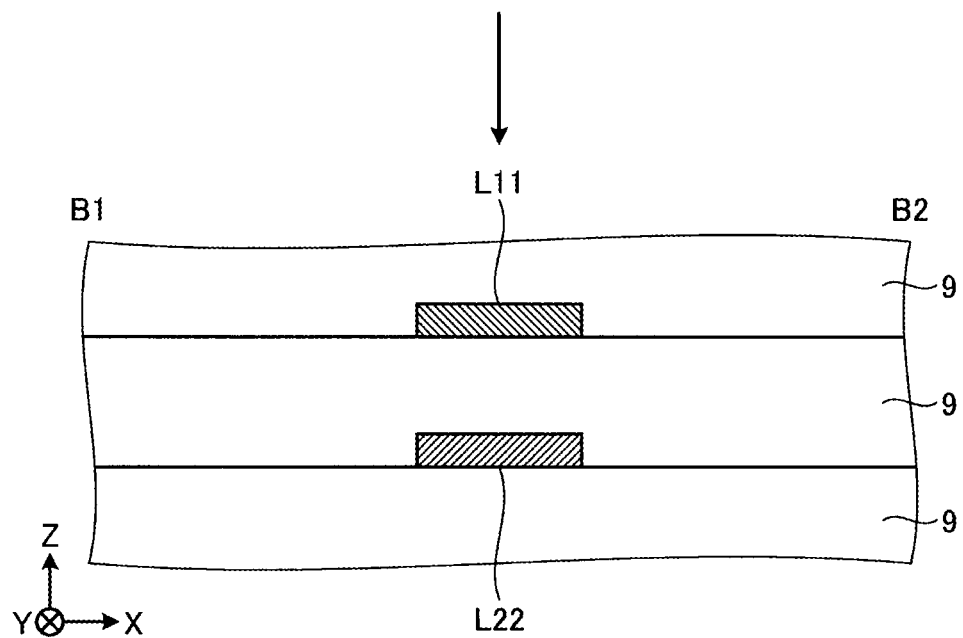
FIG. 4B is a cross-sectional view taken along line B1-B2 illustrated in FIG. 3.

FIG. 4A is a cross-sectional view taken along line A1-A2 illustrated in FIG. 3. FIG. 4B is a cross-sectional view taken along line B1-B2 illustrated in FIG. 3.

As illustrated in FIG. 4A, the first matching inductor L21 and second power supply inductor L12 are disposed on different wire layers, and they overlap each other with an insulating layer 9 interposed therebetween when the substrate 2 is seen in a plan view (in a direction indicated with an arrow in FIG. 4A). In FIG. 4A, the inductor wire constituting the first matching inductor L21 and the inductor wire constituting the second power supply inductor L12 completely overlap each other. The present embodiment also includes the case where they overlap each other at least partially.

As described herein, because of the arrangement where the second power supply inductor L12, which is disposed in the power supply path to the second power amplifier 6, and the first matching inductor L21, which is disposed in the output matching circuit for the first power amplifier 5, are disposed on different wire layers and they overlap each other with the insulating layer 9 interposed therebetween when the substrate 2 is seen in a plan view, the circuit area in the substrate 2 can be reduced, and the high-frequency front-end circuit 1 can be miniaturized.

As illustrated in FIG. 4B, the second matching inductor L22 and first power supply inductor L11 are disposed on different wire layers, and they overlap each other with the insulating layer 9 interposed therebetween when the substrate 2 is seen in a plan view (in a direction indicated with an arrow in FIG. 4B). In FIG. 4B, the inductor wire constituting the second matching inductor L22 and the inductor wire constituting the first power supply inductor L11 completely overlap each other. The present embodiment also includes the case where they overlap each other at least partially.

As described herein, because of the arrangement where the first power supply inductor L11, which is disposed in the power supply path to the first power amplifier 5, and the second matching inductor L22, which is disposed in the output matching circuit for the second power amplifier 6, are disposed on different wire layers and they overlap each other with the insulating layer 9 interposed therebetween when the substrate 2 is seen in a plan view, the circuit area in the substrate 2 can be reduced, and the high-frequency front-end circuit 1 can be miniaturized.

The first matching inductor L21 and second matching inductor L22 may be disposed on the same wire layer or may be disposed on different wire layers. The first power supply inductor L11 and second power supply inductor L12 may be disposed on the same wire layer or may be disposed on different wire layers. The first matching inductor L21 and second power supply inductor L12 may be disposed on the same wire layer or may be disposed on different wire layers. The second matching inductor L22 and first power supply inductor L11 may be disposed on the same wire layer or may be disposed on different wire layers.

Furthermore, in the present disclosure, as described above, the first matching inductor L21 for the first power amplifier 5 and the second power supply inductor L12 for the second power amplifier 6 overlap each other, and the second matching inductor L22 for the second power amplifier 6 and the first power supply inductor L11 for the first power amplifier 5 overlap each other.

As described above, the present disclosure illustrates the configuration in which the first power amplifier 5 and second power amplifier 6 operate exclusively. Thus, even if the first matching inductor L21 for the first power amplifier 5 and the second power supply inductor L12 for the second power amplifier 6 are coupled to each other, there is no degradation in output characteristics caused by mutual interference. Additionally, even if the second matching inductor L22 for the second power amplifier 6 and the first power supply inductor L11 for the first power amplifier 5 are electromagnetically coupled to each other, there is no degradation in output characteristics caused by mutual interference. Accordingly, the high-frequency front-end circuit 1 can be miniaturized while the degradation in output characteristics for high-frequency signals can be suppressed.

Second Embodiment

Figure 5:
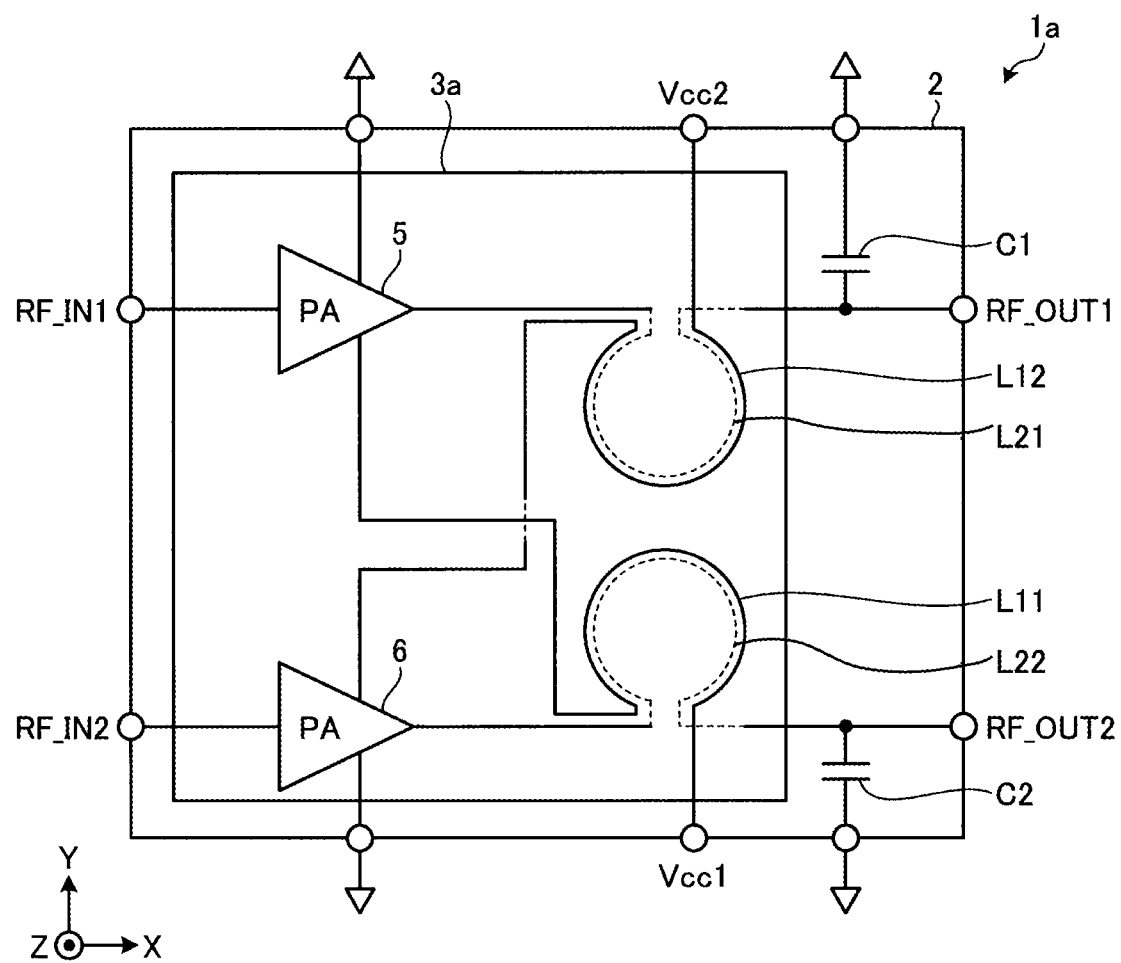
FIG. 5 is a schematic diagram illustrating a configuration of a high-frequency front-end circuit according to a second embodiment.

FIG. 5 is a schematic diagram illustrating a configuration of a high-frequency front-end circuit according to a second embodiment. The same elements as those in the first embodiment have the same reference numerals and are not described here.

In the present embodiment, the first power amplifier 5, second power amplifier 6, first power supply inductor L11, second power supply inductor L12, first matching inductor L21, and second matching inductor L22 are disposed on or in a substrate 3a.

In the present embodiment, the substrate 3a is a semiconductor substrate and constitutes an IC chip arranged on the substrate 2. The IC chip includes the first power amplifier 5, second power amplifier 6, first power supply inductor L11, second power supply inductor L12, first matching inductor L21, and second matching inductor L22, and is mounted on the substrate 2, which is a non-semiconductor substrate, and they constitute a high-frequency front-end circuit 1a. In the present embodiment, the first capacitor C1 and second capacitor C2 are disposed on or in the substrate 2.

The substrate 3a in the present embodiment corresponds to "first substrate" in the present disclosure. The substrate 2 in the present embodiment corresponds to "second substrate" in the present disclosure.

The first power supply inductor L11, second power supply inductor L12, first matching inductor L21, and second matching inductor L22 are formed of conductors disposed on or in the wire layers in the substrate 3a. The first capacitor C1 and second capacitor C2 may be formed of conductors disposed on or in the wire layers in the substrate 2 or may be SMDs mounted on the surface of the substrate 2. Each of the first power supply inductor L11, second power supply inductor L12, first matching inductor L21, and second matching inductor L22 may be a combination of an inductor wire formed of a conductor disposed on or in the substrate 3a and a SMD mounted on the surface of the substrate 2 to obtain a necessary individual inductance value. In the following description, the configuration in which each of the first power supply inductor L11, second power supply inductor L12, first matching inductor L21, and second matching inductor L22 is formed of the inductor wire alone is described as an example, but the present disclosure is not limited to that example.

The arrangement structure of the first power supply inductor L11, second power supply inductor L12, first matching inductor L21, and second matching inductor L22 is substantially the same as that in the first embodiment. In the present embodiment, the first matching inductor L21 and second power supply inductor L12 are disposed on or in different wire layers in the substrate 3a, and when the substrate 3a is seen in a plan view, they overlap each other with the insulating layer interposed therebetween. The second matching inductor L22 and first power supply inductor L11 are also disposed on or in different wire layers in the substrate 3a, and when the substrate 3a is seen in a plan view, they overlap each other with the insulating layer interposed therebetween. In FIG. 5, the inductor wire constituting the first matching inductor L21 and the inductor wire constituting the second power supply inductor L12 completely overlap each other. The present embodiment also includes the case where they overlap each other at least partially. In FIG. 5, the inductor wire constituting the second matching inductor L22 and the inductor wire constituting the first power supply inductor L11 completely overlap each other. The present embodiment also includes the case where they overlap each other at least partially.

The present embodiment is also the configuration in which the first power amplifier 5 and second power amplifier 6 operate exclusively. Thus, even if the first matching inductor L21 for the first power amplifier 5 and the second power supply inductor L12 for the second power amplifier 6 are coupled to each other, there is no degradation in output characteristics caused by mutual interference. Additionally, even if the second matching inductor L22 for the second power amplifier 6 and the first power supply inductor L11 for the first power amplifier 5 are electromagnetically coupled to each other, there is no degradation in output characteristics caused by mutual interference. Accordingly, similar to the first embodiment, the high-frequency front-end circuit 1a can be miniaturized while the degradation in output characteristics for high-frequency signals can be suppressed.

Third Embodiment

Figure 6:
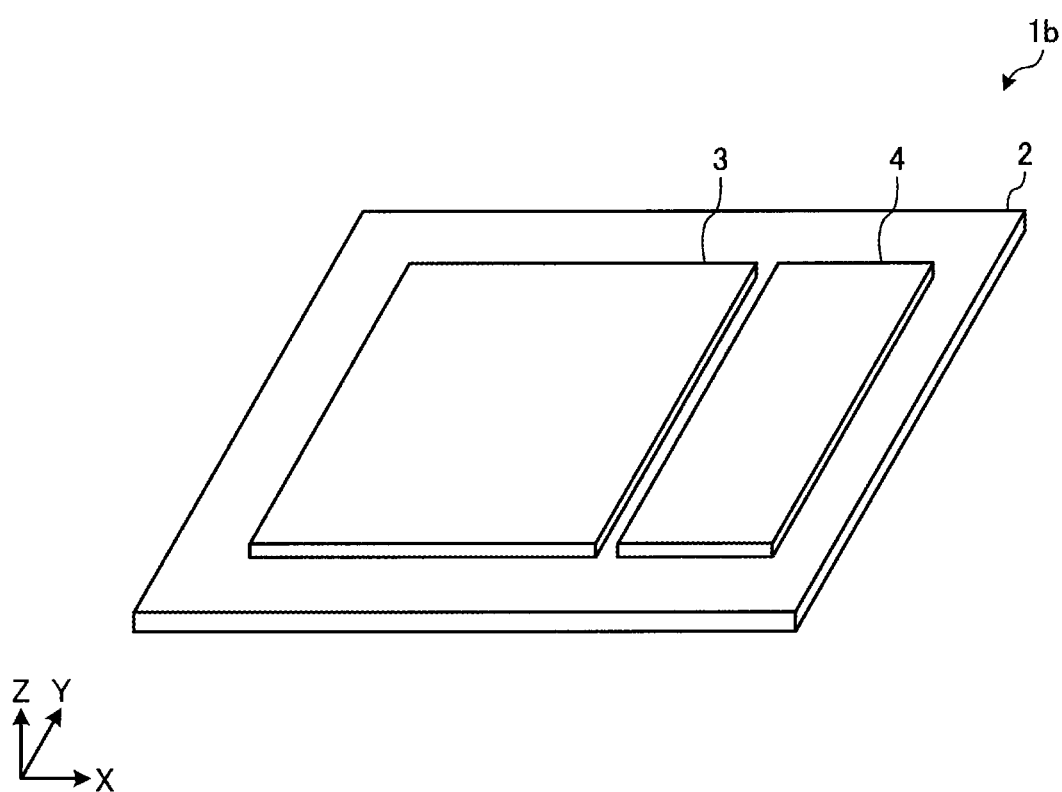
FIG. 6 illustrates an external appearance of a high-frequency front-end circuit according to a third embodiment.
Figure 7:
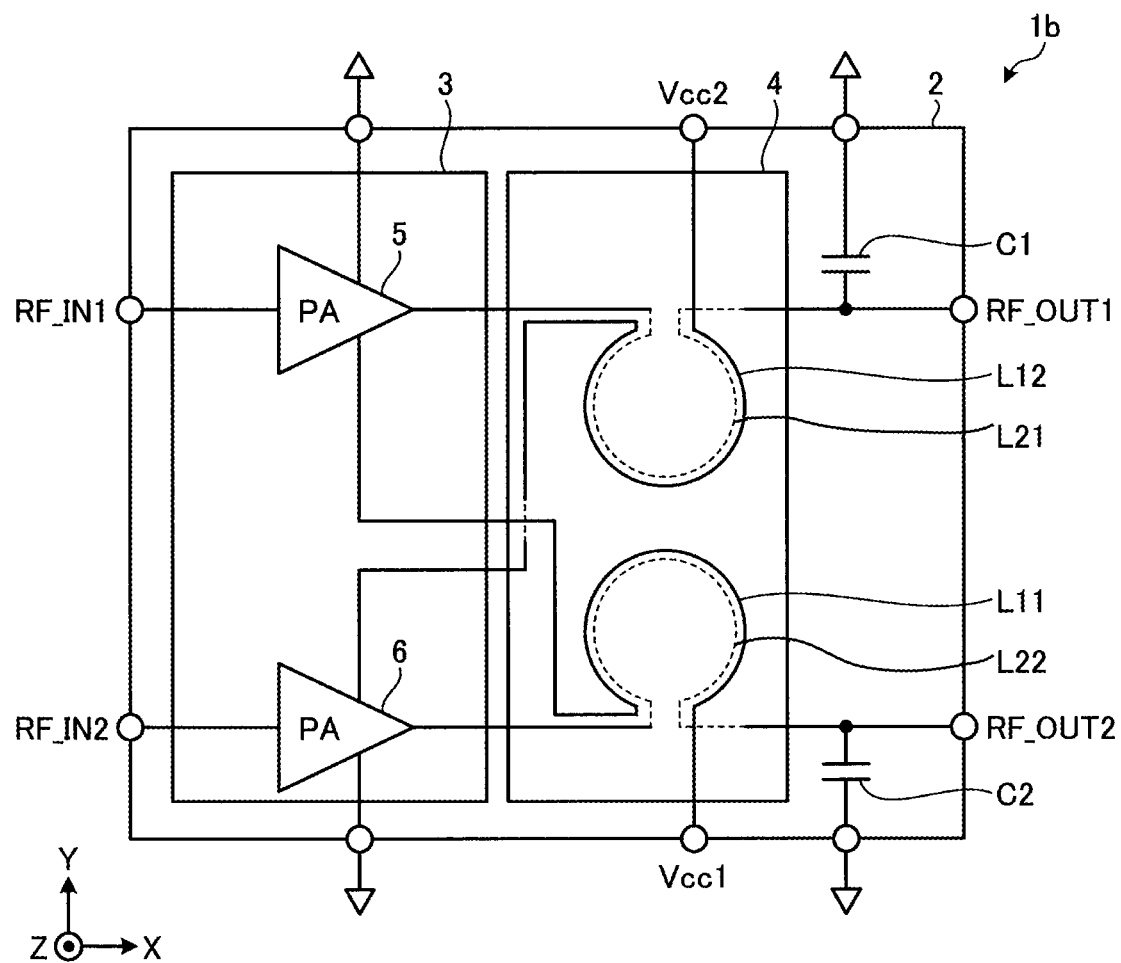
FIG. 7 is a schematic diagram illustrating a configuration of the high-frequency front-end circuit according to the third embodiment.

FIG. 6 illustrates an external appearance of a high-frequency front-end circuit according to a third embodiment. FIG. 7 is a schematic diagram illustrating a configuration of the high-frequency front-end circuit according to the third embodiment. The same elements as those in the first and second embodiments have the same reference numerals and are not described here.

A high-frequency front-end circuit 1b according to the third embodiment includes the substrate 2, the substrate 3, and a substrate 4.

The substrate 4 is a semiconductor substrate. As the substrate 4, an integrated passive device (IPD) is illustrated as an example.

The substrate 4 is substantially parallel with an X-Y plane. As viewed from a Z direction, the substrate 4 overlaps the substrate 2. The substrate 2 has an area equal to or larger than the region overlapping the substrates 3 and 4.

In the present embodiment, the first power amplifier 5 and second power amplifier 6 are disposed on the substrate 3.

In the present embodiment, the substrate 4 is a semiconductor substrate and constitutes an IPD arranged on the substrate 2. The IPD includes the first power supply inductor L11, second power supply inductor L12, first matching inductor L21, and second matching inductor L22, and is mounted on the substrate 2, which is a non-semiconductor substrate, and they constitute the high-frequency front-end circuit 1b. In the present embodiment, the first capacitor C1 and second capacitor C2 are disposed on or in the substrate 2.

The substrate 3 in the present embodiment corresponds to "first substrate" in the present disclosure. The substrate 4 in the present embodiment corresponds to "second substrate" in the present disclosure. The substrate 2 in the present embodiment corresponds to "third substrate" in the present disclosure.

The first power supply inductor L11, second power supply inductor L12, first matching inductor L21, and second matching inductor L22 are formed of conductors disposed on or in the wire layers in the substrate 4. The first capacitor C1 and second capacitor C2 may be formed of conductors disposed on or in the wire layers in the substrate 2 or may be SMDs mounted on the surface of the substrate 2. Each of the first power supply inductor L11, second power supply inductor L12, first matching inductor L21, and second matching inductor L22 may be a combination of an inductor wire formed of a conductor disposed on or in the substrate 4 and a SMD mounted on the surface of the substrate 2 to obtain a necessary individual inductance value. In the following description, the configuration in which each of the first power supply inductor L11, second power supply inductor L12, first matching inductor L21, and second matching inductor L22 is formed of the inductor wire alone is described as an example, but the present disclosure is not limited to that example.

The arrangement structure of the first power supply inductor L11, second power supply inductor L12, first matching inductor L21, and second matching inductor L22 is substantially the same as that in the first and second embodiments. In the present embodiment, the first matching inductor L21 and second power supply inductor L12 are disposed on or in different wire layers in the substrate 4, and when the substrate 4 is seen in a plan view, they overlap each other with the insulating layer interposed therebetween. The second matching inductor L22 and first power supply inductor L11 are also disposed on or in different wire layers in the substrate 4, and when the substrate 4 is seen in a plan view, they overlap each other with the insulating layer interposed therebetween. In FIG. 7, the inductor wire constituting the first matching inductor L21 and the inductor wire constituting the second power supply inductor L12 completely overlap each other. The present embodiment also includes the case where they overlap each other at least partially. In FIG. 7, the inductor wire constituting the second matching inductor L22 and the inductor wire constituting the first power supply inductor L11 completely overlap each other. The present embodiment also includes the case where they overlap each other at least partially.

The present embodiment is also the configuration in which the first power amplifier 5 and second power amplifier 6 operate exclusively. Thus, even if the first matching inductor L21 for the first power amplifier 5 and the second power supply inductor L12 for the second power amplifier 6 are coupled to each other, there is no degradation in output characteristics caused by mutual interference. Additionally, even if the second matching inductor L22 for the second power amplifier 6 and the first power supply inductor L11 for the first power amplifier 5 are electromagnetically coupled to each other, there is no degradation in output characteristics caused by mutual interference. Accordingly, similar to the first and second embodiments, the high-frequency front-end circuit 1b can be miniaturized while the degradation in output characteristics for high-frequency signals can be suppressed.

The above-described embodiments are intended to facilitate the understanding of the present disclosure but are not to be construed as limiting the present disclosure. The present disclosure can be changed or modified without departing from its spirit and includes its equivalents.

The present disclosure can have the above-described configurations. Alternatively, the present disclosure can have configurations described below in place of the above-described configurations.

(1) A high-frequency front-end circuit includes a plurality of power amplifiers, a plurality of power supply inductors disposed in power supply paths to the plurality of power amplifiers, respectively, output matching circuits connected to output terminals of the plurality of power amplifiers, respectively, each of the output matching circuits including a matching inductor, and a substrate on or in which at least the power supply inductors and the matching inductors are disposed. Each of the power supply inductors includes a power supply inductor wire formed of a conductor at least partially disposed on or in the substrate. Each of the matching inductors includes a power supply inductor wire formed of a conductor at least partially disposed on or in the substrate. The plurality of power amplifiers include a first power amplifier and a second power amplifier different from the first power amplifier, and a first power supply inductor wire disposed in the power supply path to the first power amplifier and a second matching inductor wire disposed in the output matching circuit for the second power amplifier are disposed on or in different layers in the substrate. When the substrate is seen in a plan view, at least a portion of the first power supply inductor wire and at least a portion of the second matching inductor wire overlap each other with an insulating layer interposed therebetween.

In that configuration, the high-frequency front-end circuit can be miniaturized while the degradation in output characteristics for high-frequency signals can be suppressed.

(2) In the high-frequency front-end circuit of the above-described (1), a second power supply inductor wire disposed in the power supply path to the second power amplifier and a first matching inductor wire disposed in the output matching circuit for the first power amplifier may be disposed on or in different layers in the substrate. When the substrate is seen in a plan view, at least a portion of the second power supply inductor wire and at least a portion of the first matching inductor wire may overlap each other with an insulating layer interposed therebetween.

(3) The high-frequency front-end circuit of the above-described (1) may include a first substrate on which the first power amplifier and the second power amplifier are disposed and a second substrate on or in which the first power supply inductor wire and the second matching inductor wire are disposed.

(4) The high-frequency front-end circuit of the above-described (2) may include a first substrate on which the first power amplifier and the second power amplifier are disposed and a second substrate on or in which the first power supply inductor wire, the first matching inductor wire, the second power supply inductor wire, and the second matching inductor wire are disposed.

(5) The high-frequency front-end circuit of the above-described (1) may include a first substrate on or in which the first power amplifier, the second power amplifier, the first power supply inductor wire, and the second matching inductor wire are disposed and a second substrate on which the first substrate is arranged.

(6) The high-frequency front-end circuit of the above-described (2) may include a first substrate on or in which the first power amplifier, the second power amplifier, the first power supply inductor wire, the first matching inductor wire, the second power supply inductor wire, and the second matching inductor wire are disposed and a second substrate on which the first substrate is arranged.

(7) In the high-frequency front-end circuit of any one of the above-described (3) to (6), the first substrate may be a semiconductor substrate.

(8) The high-frequency front-end circuit of the above-described (1) may include a first substrate on which the first power amplifier and the second power amplifier are disposed, a second substrate on or in which the first power supply inductor wire and the second matching inductor wire are disposed, and a third substrate on which the first substrate and the second substrate are arranged.

(9) The high-frequency front-end circuit of the above-described (2) may include a first substrate on which the first power amplifier and the second power amplifier are disposed, a second substrate on or in which the first power supply inductor wire, the first matching inductor wire, the second power supply inductor wire, and the second matching inductor wire are disposed, and a third substrate on which the first substrate and the second substrate are arranged.

(10) In the high-frequency front-end circuit of the above-described (9), the first substrate and the second substrate may be semiconductor substrates.

In the present disclosure, the high-frequency front-end circuit can be miniaturized while the degradation in output characteristics for high-frequency signals can be suppressed.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency front-end circuit comprising:
a plurality of power amplifiers;
a plurality of power supply inductors disposed in power supply paths to the plurality of power amplifiers, respectively;
output matching circuits connected to output terminals of the plurality of power amplifiers, respectively, each of the output matching circuits including a matching inductor; and
a substrate on or in which at least the power supply inductors and the matching inductors are disposed,
wherein each of the power supply inductors includes a power supply inductor wire comprising a conductor at least partially disposed on or in the substrate,
each of the matching inductors includes a matching inductor wire comprising a conductor at least partially disposed on or in the substrate,
the plurality of power amplifiers include a first power amplifier and a second power amplifier different from the first power amplifier, and a first power supply inductor wire disposed in the power supply path to the first power amplifier and a second matching inductor wire disposed in the output matching circuit for the second power amplifier are disposed on or in different layers in the substrate, and
when the substrate is seen in a plan view,
at least a portion of the first power supply inductor wire and at least a portion of the second matching inductor wire overlap each other with an insulating layer interposed therebetween.

2. The high-frequency front-end circuit according to claim 1, wherein a second power supply inductor wire disposed in the power supply path to the second power amplifier and a first matching inductor wire disposed in the output matching circuit for the first power amplifier are disposed on or in different layers in the substrate, and
when the substrate is seen in a plan view,
at least a portion of the second power supply inductor wire and at least a portion of the first matching inductor wire overlap each other with an insulating layer interposed therebetween.

3. The high-frequency front-end circuit according to claim 1, comprising:
a first substrate on which the first power amplifier and the second power amplifier are disposed; and
a second substrate on or in which the first power supply inductor wire and the second matching inductor wire are disposed.

4. The high-frequency front-end circuit according to claim 2, comprising:
a first substrate on which the first power amplifier and the second power amplifier are disposed; and
a second substrate on or in which the first power supply inductor wire, the first matching inductor wire, the second power supply inductor wire, and the second matching inductor wire are disposed.

5. The high-frequency front-end circuit according to claim 1, comprising:
a first substrate on or in which the first power amplifier, the second power amplifier, the first power supply inductor wire, and the second matching inductor wire are disposed; and
a second substrate on which the first substrate is arranged.

6. The high-frequency front-end circuit according to claim 2, comprising:
- a first substrate on or in which the first power amplifier, the second power amplifier, the first power supply inductor wire, the first matching inductor wire, the second power supply inductor wire, and the second matching inductor wire are disposed; and
- a second substrate on which the first substrate is arranged.

7. The high-frequency front-end circuit according to claim 3, wherein the first substrate is a semiconductor substrate.

8. The high-frequency front-end circuit according to claim 1, comprising:
- a first substrate on which the first power amplifier and the second power amplifier are disposed;
- a second substrate on or in which the first power supply inductor wire and the second matching inductor wire are disposed; and
- a third substrate on which the first substrate and the second substrate are arranged.

9. The high-frequency front-end circuit according to claim 2, comprising:
- a first substrate on which the first power amplifier and the second power amplifier are disposed;
- a second substrate on or in which the first power supply inductor wire, the first matching inductor wire, the second power supply inductor wire, and the second matching inductor wire are disposed; and
- a third substrate on which the first substrate and the second substrate are arranged.

10. The high-frequency front-end circuit according to claim 9, wherein the first substrate and the second substrate are semiconductor substrates.

11. The high-frequency front-end circuit according to claim 1, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

12. The high-frequency front-end circuit according to claim 4, wherein the first substrate is a semiconductor substrate.

13. The high-frequency front-end circuit according to claim 5, wherein the first substrate is a semiconductor substrate.

14. The high-frequency front-end circuit according to claim 6, wherein the first substrate is a semiconductor substrate.

15. The high-frequency front-end circuit according to claim 2, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

16. The high-frequency front-end circuit according to claim 3, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

17. The high-frequency front-end circuit according to claim 4, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

18. The high-frequency front-end circuit according to claim 5, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

19. The high-frequency front-end circuit according to claim 6, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

20. The high-frequency front-end circuit according to claim 7, wherein an operating frequency of the first power amplifier and an operating frequency of the second power amplifier are different, and
when the first power amplifier is in operation, the second power amplifier does not operate, or when the second power amplifier is in operation, the first power amplifier does not operate.

21. The high-frequency front-end circuit according to claim 1, wherein the power supply inductors supply a first power supply voltage and a second power supply voltage to the first power amplifier and the second power amplifier, respectively.

22. The high-frequency front-end circuit according to claim 1, wherein each of the output matching circuits further includes a capacitor.

* * * * *